United States Patent
Romanovskyy et al.

(10) Patent No.: US 8,345,498 B2
(45) Date of Patent: Jan. 1, 2013

(54) SENSE AMPLIFIER

(75) Inventors: Sergiy Romanovskyy, Ottawa (CA); Muhammad Nummer, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 136 days.

(21) Appl. No.: 13/029,632

(22) Filed: Feb. 17, 2011

(65) Prior Publication Data

US 2012/0213015 A1 Aug. 23, 2012

(51) Int. Cl.
*G11C 7/00* (2006.01)
(52) U.S. Cl. .................. 365/205; 365/191; 327/51
(58) Field of Classification Search .............. 365/205, 365/191, 207; 327/51, 52
See application file for complete search history.

(56) References Cited

U.S. PATENT DOCUMENTS 7,522,462 B2 * 4/2009 Edahiro et al. ............... 365/205

OTHER PUBLICATIONS

Kawahara, Takayuki et al., "A High-Speed, Small-Area, Threshold-Voltage-Mismatch Compensation Sense Amplifier for Gigabit-Scale DRAM Arrays", IEEE Journal of Solid-State Circuits, vol. 28, No. 7, Jul. 1993, pp. 816-823.

* cited by examiner

*Primary Examiner* — Huan Hoang
(74) *Attorney, Agent, or Firm* — Lowe Hauptman Ham & Berner, LLP (57) ABSTRACT

A sense amplifier includes a first PMOS transistor, a second PMOS transistor, a third PMOS transistor, a fourth PMOS transistor, a first NMOS transistor, a second NMOS transistor, a third NMOS transistor, and a fourth NMOS transistor. The first PMOS transistor, the second PMOS transistor, the first NMOS transistor, and the second NMOS transistor form cross coupled sensing pairs. The third PMOS and the fourth PMOS transistors serve as compensation transistors. The third NMOS and the fourth NMOS transistors serve as sensing enabling transistors.

20 Claims, 5 Drawing Sheets

SENSE AMPLIFIER

FIELD

The present disclosure is related to a sense amplifier with offset compensation.

BACKGROUND

A bit line sense amplifier in embedded Dynamic Random Access Memory (eDRAM) generally includes one or two cross-coupled transistor or device pairs. Ideally, each device parameter such as threshold voltage Vt, transconductance coefficient β, node capacitance, etc., of one transistor in the transistor pair is the same as that of the other transistor in the same transistor pair. Manufacturing process deviations, however, cause differences or offsets in parameters of different transistors. As a result, two transistors even though manufactured by the same process intrinsically have two threshold voltages Vt with two different values. Many techniques have been used to compensate for the difference in threshold voltages Vt. Most of the techniques, however, are not applicable for use in eDRAMs that are manufactured by advanced technology in the nano-scale and/or operate above 300 MHz.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The disclosed compensation mechanisms allow minimum offset and steady operation of a sense amplifier in gigabit scale eDRAMs, and increased memory density and performance. However, only offset of the NMOS cross-coupled sensing pair is compensated. Because the bit lines in the memory array are pre-charged to ground, not to conventional level of ~0.5×VDD, a special generator is not required. The pre-charge and equalizing transistors receive a gate voltage that does not exceed the operational voltage VDD. As a result, the transistors have high performance, are reliable, and can be regular logic thin-oxide transistors. Hence, a generator which provides the voltage level higher than VDD can have a lower generation capacity and occupy less area. Because of the compensation less bit line split is required and therefore enables a bit line to couple additional memory cells. Consequently, the memory is denser. The global bit lines are discharged through two instead of three NMOS transistor in a serial like manner. The read current is therefore larger that allows a faster data transfer from a (local) bit line to a global bit line, than circuits using three NMOS transistors. Only one signal is used to control the sense amplifier mode, which is advantageous over other approaches that use two signals.

Exemplary Circuit

Figure 1:
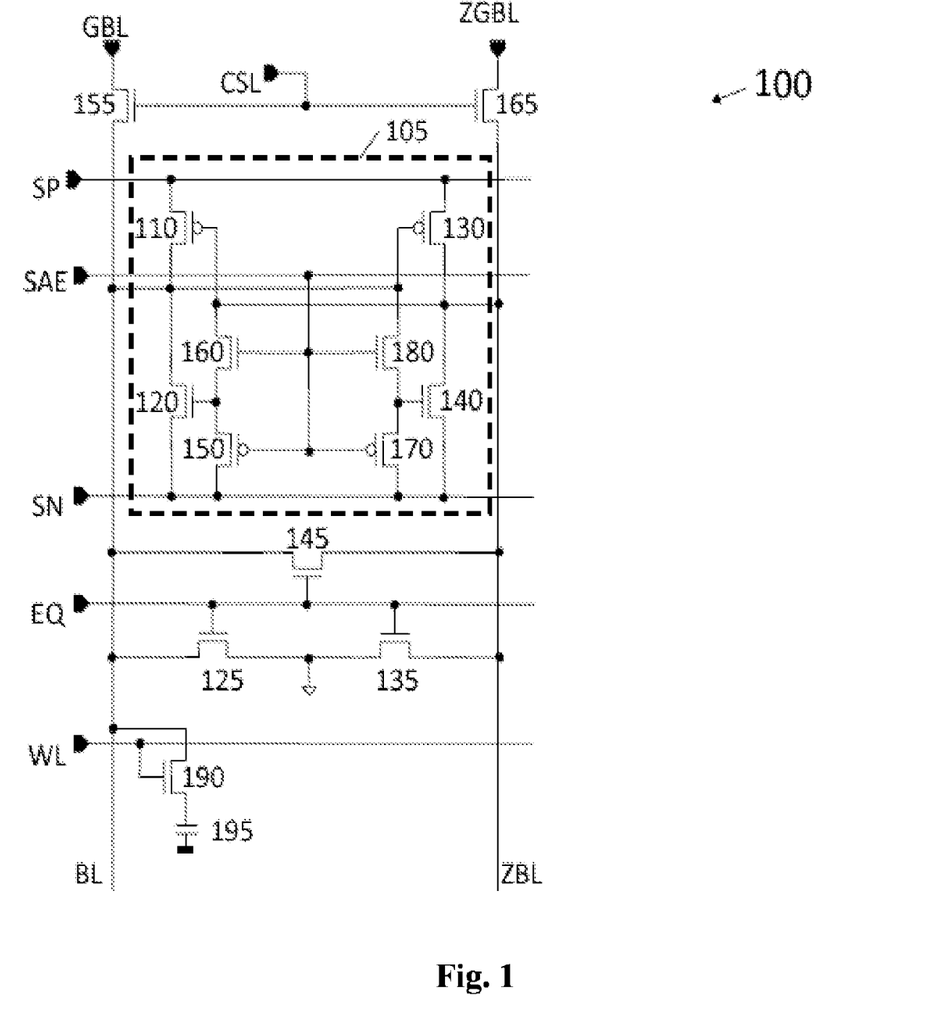
FIG. 1 is a diagram of a circuit illustrating a sense amplifier used in conjunction with a memory cell, in accordance with some embodiments.

FIG. 1 is a diagram of a circuit 100 illustrating a sense amplifier 105 being used in conjunction with a memory cell 195, in accordance with some embodiments. Transistor 190 allows access between sense amplifier 105 and memory cell 195 through bit lines BL and ZBL. Bit lines BL and ZBL are connected to an equal number of memory cells, but only one transistor 190 and one capacitor 195 are shown for illustration.

Signal EQ and transistors 125, 135, and 145 are used to pre-charge and equalize bit lines BL and ZBL. The term "pre-charge" instead of "charge" is commonly used to indicate that bit lines BL and ZBL are charged prior to sensing or reading. Transistor 145 is coupled between bit lines BL and ZBL. Transistors 125 and 135 are coupled in series between bit lines BL and ZBL. When signal EQ is applied with a high logic level (a High), transistors 125, 135, and 145 are turned on allowing bit lines BL and ZBL to be at the same ground level at the drains of transistors 125 and 135. Stated differently, bit lines BL and ZBL are pre-charged and equalized to ground. In this aspect, various embodiments are different from other approaches in which bit lines BL and ZBL are pre-charged to a voltage level different from ground, such as 0.5×VDD. In some embodiments, the high logic level of signal EQ is operational voltage VDD readily available for use because voltage VDD is used by other transistors.

Word line WL turns on or off transistor 190 to allow access to memory cell 195 through transistor 190. In the example of FIG. 1, transistor 190 and memory cell 195 are electrically coupled to bit line BL for illustration. Depending on implementations in a memory array, some memory cells may be connected to bit line BL while some other memory cells may be connected to bit line ZBL. When word line WL at the gate of transistor 190 is applied with a low logic level (a Low), word line WL turns off transistor 190 and thus electrically disconnects memory cell 195 from bit line BL or from sense amplifier 105. When word line WL is applied with a High, however, word line WL turns on transistor 190 and thus electrically connects memory cell 195 to a bit line BL. In some embodiments, the high voltage level of word line WL is about 1.3×VDD, and the low voltage level of word line WL is below ground.

In some embodiments, memory cell 195 is a capacitor storing charge. When memory cell 195 is connected to a bit line BL as shown in FIG. 1, memory cell 195 shares the same charge with bit line BL. Depending on the charge indicating the logic level of memory cell 195, bit line BL is pulled one way or another. For example, if memory cell 195 stores a low logic level (e.g., a Low), bit line BL is pulled towards ground. Conversely, if memory cell 195 stores a high logic level, then bit line BL is pulled towards voltage VDD. After sharing the charge, the voltage difference between bit line BL and bit line ZBL, commonly called a bit line split, starts to develop. The amplitude of the bit line split depends on the charge transfer ratio or capacitance of memory cell 195 and bit line BL. If bit line BL is longer and connected to a lot of memory cells, the charge ratio becomes smaller and the bit line split is reduced. Conversely, if bit line BL is shorter and connected to a less memory cells, the charge ratio becomes higher and the bit line split is increased.

Bit lines BL and ZBL serve as both data input and output (TO) for sense amplifier 105. Generally, except when being pre-charged and equalized, bit lines BL and ZBL are of the opposite level of one another. For example, if bit line BL is Low then bit line ZBL is High but if bit line BL is High, then bit line ZBL is Low. In a write cycle, applying a logic level to a first bit line, and the opposite level to the other bit line, enables writing the logic level at the first bit line to memory cell 195. For example, applying a High to bit line BL and a Low to bit line ZBL, enables memory cell 195 to be written with a High. Conversely, applying a Low to bit line BL and a High to bit line ZBL, enables memory cell 195 to be written with a Low.

In a read cycle, sensing or reading the logic levels at bit lines BL and ZBL reveals the data stored in memory cell 195. For example, if memory cell 195 stores a High, then sensing bit line BL reveals a High. Conversely, if memory cell 195 stores a Low then sensing bit line BL reveals a Low. When there is bit line split between bit lines BL and ZBL, then there is a difference in voltage VGS of transistors 110 and 120 as compared to VGS of transistors 130 and 140. Sense amplifier 105 senses or amplifies this voltage difference. Voltage VGS is the voltage from a gate to a source of a transistor.

Signal CSL and transistors 155 and 165 enable the data transfer between bit lines BL and ZBL, and global bit lines GBL and ZGBL, respectively. For example, when signal CSL at the gates of NMOS transistors 155 and 165 is applied with a Low, transistors 155 and 165 are off, and act as open circuits. Global bit lines GBL and ZGBL are electrically disconnected from the respective bit lines BL and ZBL. When signal CSL, however, is applied with a High, transistors 155 and 165 are on and act as short circuits. Effectively, the data on bit lines BL and ZBL are transferred to respective global bit lines GBL and ZGBL.

Signals SP and SN are used to turn on or off sense amplifier 105. Signal SP is commonly called the positive supply voltage while signal SN is commonly called the negative supply voltage (even though in many situations signal SN has a positive voltage). In general, when signals SP and SN are at a same level, amplifier 105 is off, and when signal SP is at VDD and signal SN is at ground level, sense amplifier 105 is on.

Sense amplifier 105 includes transistors 110, 120, 130, 140, 150, 160, 170, and 180. NMOS transistor 160 is coupled between the gates of transistors 110 and 120. NMOS transistor 180 is coupled between the gates of transistors 130 and 140. PMOS transistor 150 is coupled between the gate of transistor 120 and signal SN. PMOS transistor 170 is coupled between the gate of transistor 140 and signal SN. The pair of PMOS transistors 110 and 130, and the pair of NMOS transistors 120 and 140 form the sensing pairs for sense amplifier 105. Generally, because of the mismatch, such as the mismatch caused by manufacturing process variations, NMOS transistors 120 and 140 and/or PMOS transistors 110 and 130 have different characteristics, including, for example, differences in threshold voltages Vt, which lead to different drain-to-source currents, etc.

Signal SAE together with transistors 150, 160, 170, and 180 are configured to compensate for the mismatch between transistors 120 and 140. Transistors 150 and 170 are called compensation enable transistors. The drains of transistors 150 and 170 are coupled to the gates of respective transistors 120 and 140, and to the sources of respective transistors 160 and 180. The gates of transistors 150 and 170 are coupled together, to the gates of transistors 160 and 180, and to signal SAE. The sources of transistors 150 and 170 are coupled to signal SN. Transistors 160 and 180 are called sensing enable transistors. The drain of transistor 160 is coupled to the gate of transistor 110, the drains of transistors 130 and 140, and bit line ZBL. The drain of transistor 180 is coupled to the gate of transistor 130, the drains of transistors 110 and 120, and bit line BL.

Signal SAE is coupled to the gates of transistors 160, 180, 150, and 170. Transistors 150, 160, 170, and 180 act as switches and serve as open or short circuits depending on the need of the applications as appropriate. For example, when signal SAE is applied with a Low, signal SAE turns on PMOS transistors 150 and 170, but turns off NMOS transistors 160 and 180. Transistors 160 and 180 being off, act as open circuits. Transistors 150 and 170 being on, act as short circuits to compensate for the mismatch between transistors 120 and 140.

In contrast, when signal SAE is applied with a High, signal SAE turns off PMOS transistors 150 and 170, but turns on NMOS transistors 160 and 180. Transistors 150 and 170 being off, act as open circuits. Transistors 160 and 180 being on, act as short circuits and enable sensing by transistors 110, 130, 120, and 140. In some embodiments, transistors 150 and 170 are turned on for compensation. In other words, sense amplifier 105 operates in the compensation mode. Transistors 160 and 180 are then turned on to enable sensing by sense amplifier 105. In other words, sense amplifier 105 operates in the sensing mode.

Such explanation of operation of transistors 150, 160, 170 and 180 are simplified for explanation purposes. In reality whether each of transistors 150, 160, 170 and 180 is open or closed depends on the corresponding voltages VGS and VGD rather than on only gate voltage provided by signal SAE. Voltage VGS is the voltage dropped across a gate and a source, while voltage VGD is the voltage dropped across a gate and a drain, of a transistor.

Exemplary Compensation Mode

Figure 2:
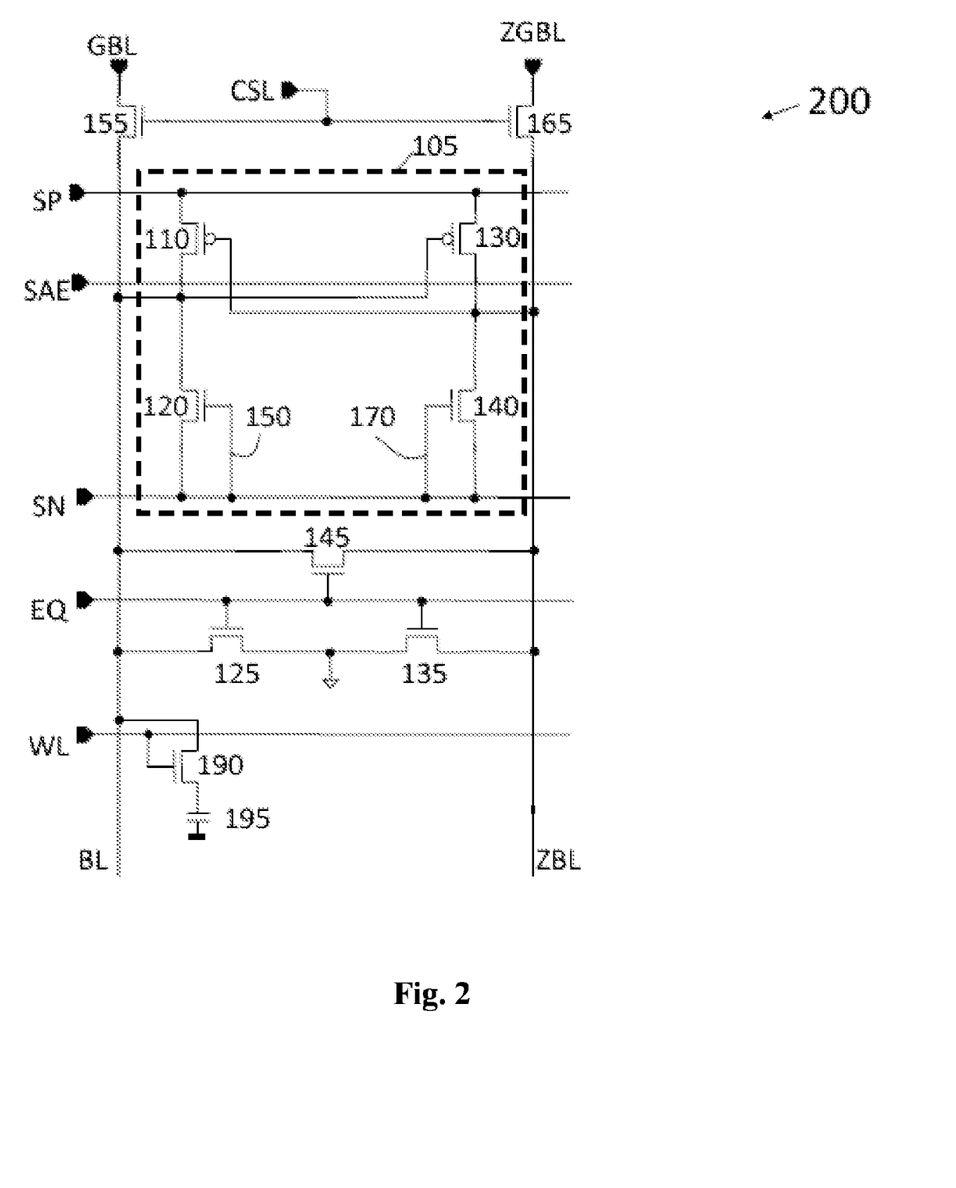
FIG. 2 is a diagram of a circuit illustrating the sense amplifier in the circuit of FIG. 1 operating in the compensation mode.

FIG. 2 is a circuit 200 illustrating sense amplifier 105 operating in the compensation mode.

In circuit 200, signal SAE is applied with a Low. As a result, because signal SAE at the gates of NMOS transistors 160 and 180 are Low, NMOS transistors 160 and 180 are turned off, and act as open circuits. For illustration, transistors 160 and 180 are not drawn. At the same time, signal SAE at the gate of PMOS transistors 150 and 170 are also Low. PMOS transistors 150 and 170 are turned on, and act as short circuits. Transistor 150 is shown as a line coupling the gate of transistor 120 with signal SN. Similarly, transistor 170 is shown as a line coupling the gate of transistor 140 with signal SN. Effectively, the gate and the source of transistor 120 are coupled together, and the gate and the source of transistors 140 are coupled together.

Because the gate and the source of transistor 120 are coupled together, transistor 120 functions as a MOS diode.

Similarly, because the gate and the source of transistor 140 are coupled together, transistor 140 also functions as a MOS diode.

Exemplary Sensing Mode

Figure 3:
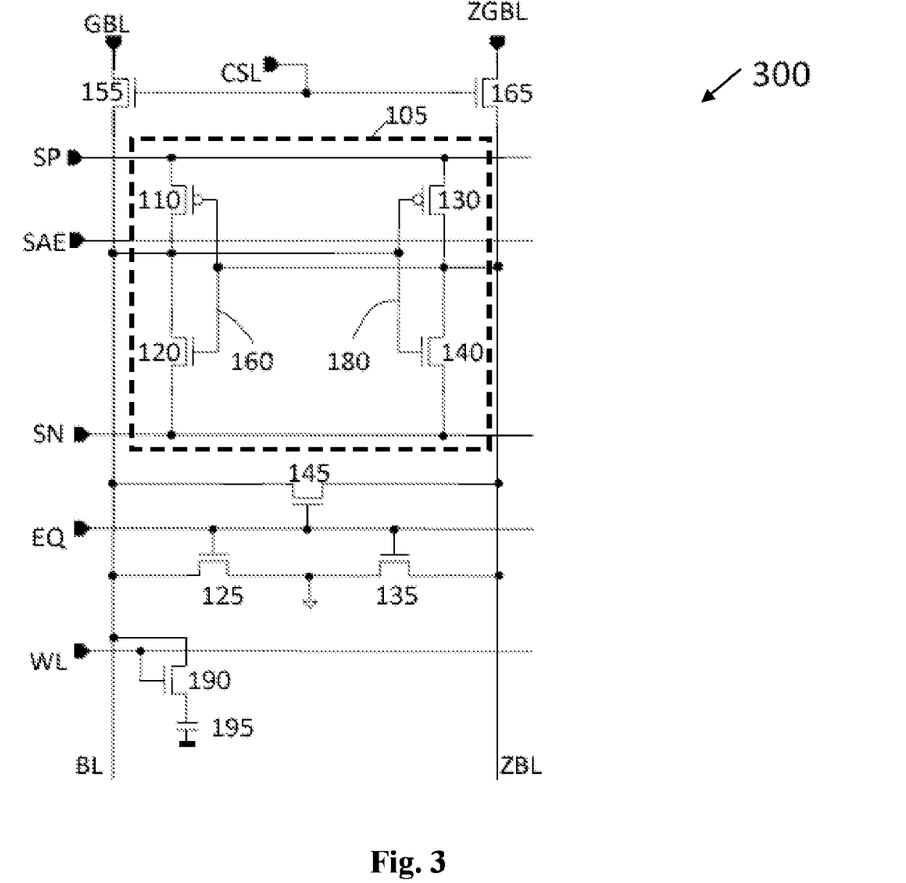
FIG. 3 is a diagram of a circuit illustrating the sense amplifier of the circuit in FIG. 1 operating in the sensing mode.

FIG. 3 is a circuit 300 illustrating sense amplifier 105 operating in the sensing mode, in accordance with some embodiments.

In circuit 300, signal SAE is applied with a High. Because signal SAE at the gates of PMOS transistors 150 and 170 are High, PMOS transistors 150 and 170 are turned off, and act as open circuits. For illustration, transistors 150 and 170 are not drawn. At the same time, because signal SAE at the gate of NMOS transistors 160 and 180 are High, NMOS transistors 160 and 180 are turned on, and act as short circuits. Transistor 160 is shown as a line coupling the gate of transistor NMOS 120 with the gate of PMOS transistor 110. Similarly, transistor 180 is shown as a line coupling the gate of NMOS transistor 140 with the gate of PMOS transistor 130.

Persons of ordinary skill in the art will recognize that transistors 110 and 120, and 130 and 140 as drawn in FIG. 3 are commonly known cross-coupled. The gates of transistors 110 and 120 are coupled together, and coupled to the drains of transistors 130 and 140, and bit line ZBL. Similarly, the gates of transistors 130 and 140 are coupled together, and coupled to the drains of transistors 110 and 120, and bit line BL.

In some embodiments, sense amplifier 105 operates in the compensation mode as illustrated in circuit 200 before operates in the sensing mode as in circuit 300.

Mathematical Calculations

For illustration, voltage VtN120 is the threshold voltage of NMOS transistor 120. Voltage VtN140 is the threshold voltage of NMOS transistor 140. Further, voltage VtN140 is less than VtN120. Voltage ΔV is the voltage difference between voltage VtN120 and VtN140. In other words, ΔV=VtN120−VtN140. Voltages VBL and VZBL are the voltages on respective bit lines BL and ZBL. Currents 1120 and 1140 are the saturation currents flowing through respective transistors 120 and 140. Voltages VGS 120 and VGS 140 are the voltages across the gate and the source of transistors 120 and 140, respectively. β is transconductance coefficient of each of transistors 120 and 140.

Without compensation, saturation currents IDS120 and IDS140 flowing through respective transistors 120 and 140 are as follows:

$$IDS120=(\beta/2)\times(VGS120-VtN120)^2$$

$$IDS140=(\beta/2)\times(VGS140-VtN140)^2$$

Because voltage VtN140 is less than voltage VtN120, current IDS140 is greater than current IDS120.

After the compensation, i.e., after amplifier 105 operates as circuit 200 in FIG. 2:

$$VBL=VZBL+(VtN120-VtN140)$$

When sense amplifier 105 operates in the sensing mode as in circuit 300 in FIG. 3:

$$VGS120 = VGS140 + \Delta V$$
$$= VGS140 + (VtN120 - VtN140)$$

As a result, $$IDS140 = \beta/2 \times (VGS140 - VtN140)^2$$
$$IDS120 = \beta/2 \times (VGS140 + VtN120 - VtN140 - VtN120)^2$$
$$= \beta/2 \times (VGS140 - VtN140)^2$$

In effect, $$IDS140=IDS120$$

In other words, the difference or mismatch between transistors 120 and 140 has been compensated.

Exemplary Method and Corresponding Waveforms

Figure 4:
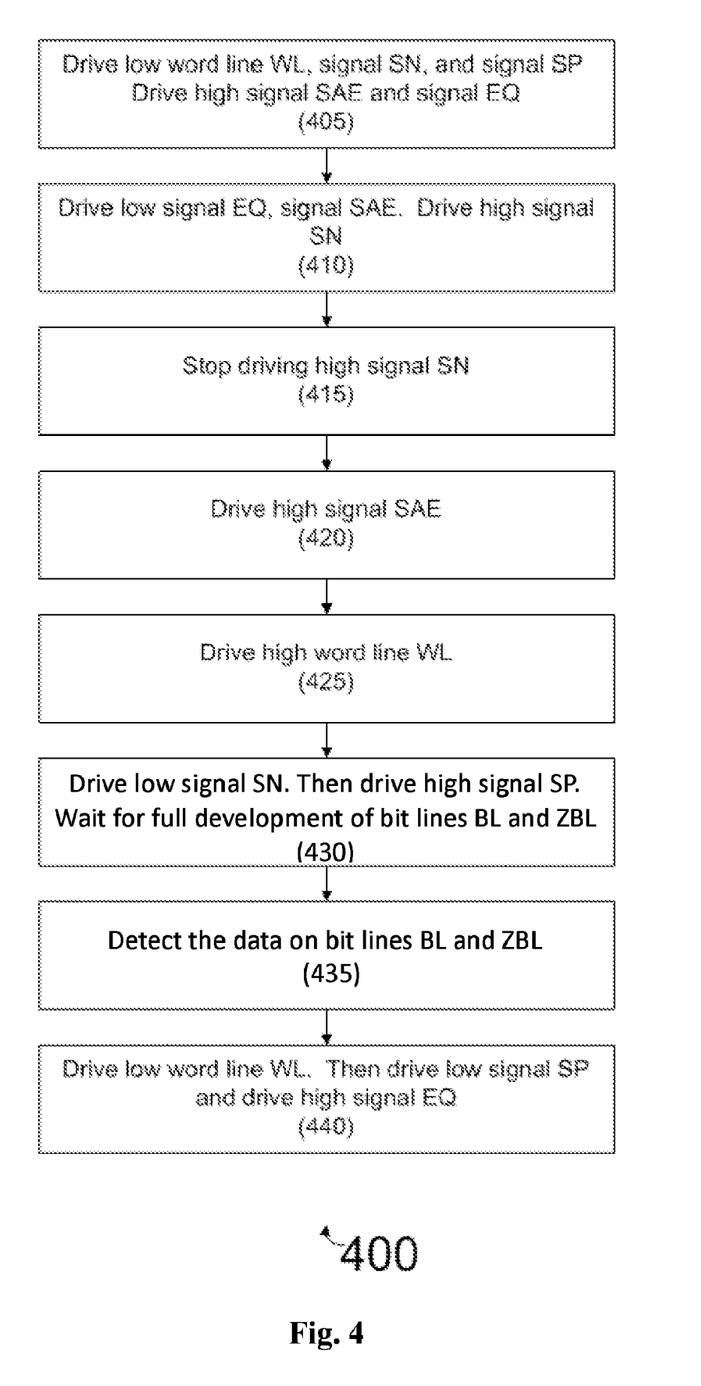
FIG. 4 is a flowchart illustrating a method of operating the circuit in FIG. 1, in accordance with some embodiments.
Figure 5:
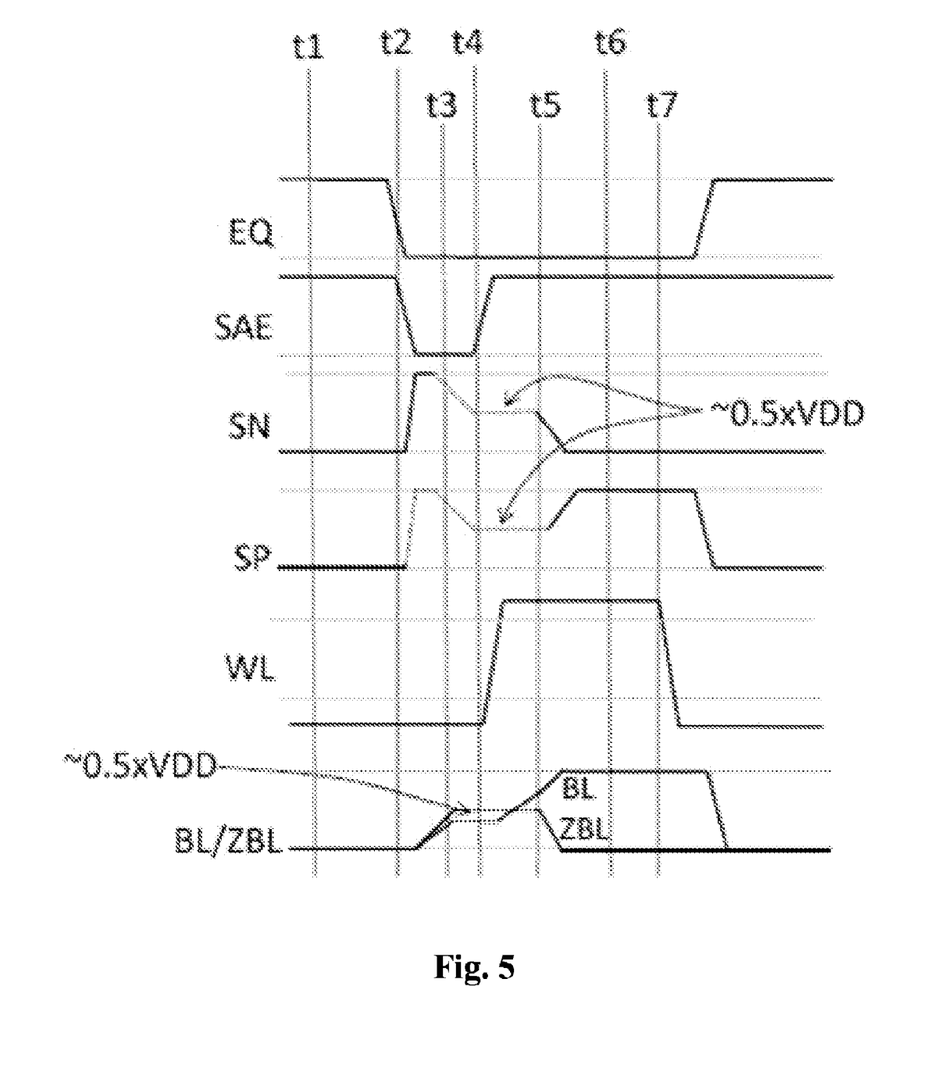
FIG. 5 is a graph of waveforms corresponding to the steps in the method of FIG. 4, in accordance with some embodiments.

FIG. 4 is a method 400 illustrating an operation of circuit 100, in accordance with some embodiments. FIG. 5 is a graph of waveforms corresponding to the steps of method 400 in FIG. 4.

In FIG. 5, unless otherwise stated, the Low and the High of the waveforms for the corresponding signals other than word line WL are respective voltages VSS and VDD. The Low and the High of word line WL are at respective −0.4 V and 1.3× VDD. Dashed lines of the waveforms denote that the corresponding nodes are not driven, but the corresponding signals react to the operation of other signals and/or circuits.

Before time t4 and after time t7, word line WL is driven Low. Memory cell 195 is not accessed for reading. In between times t4 and t7, word line WL is driven High. Memory cell 195 is accessed for reading.

In step 405 at time t1, sense amplifier 105 is put in the charging state. Word line WL is driven Low, electrically disconnecting memory cell 195 from bit line BL and sense amplifier 105. Signal SAE is driven High. Signals SN and SP are driven Low to turn off sense amplifier 105. Signal EQ is driven High to charge and equalize bit lines BL and ZBL to voltage VSS at the drains of transistors 125 and 135.

In step 410 at time t2, signal EQ is driven Low to stop charging and equalizing bit lines BL and ZBL. In some embodiments, signal EQ being Low also turns off the drivers for signals SP and SN. As a result, signals SP and SN are floating. Signal EQ remains Low during until signal EQ is driven High after time t7.

A the same time t2, signal SAE is driven Low, causing circuit 100 to operate in the compensation mode as illustrated by circuit 200. Transistors 120 and 140 function as MOS diodes.

Additionally, signal SN is driven High to voltage VDD. Signal SP thus follows signal SN. Bit line BL at the source of transistor 120 and bit line ZBL at the source of transistor 140 charge towards a High through respective transistors 120 and 140 functioning as MOS diodes. Because of the threshold voltage difference in transistors 120 and 140, bit line BL and bit line ZBL are charged to different voltage levels. For illustration purposes, threshold voltage VtN140 is less than threshold voltage VtN120. As a result, bit line ZBL is charged to a level higher than bit line BL.

In step 415 at time t3, after bit line BL and bit line ZBL are charged to about 0.5×VDD, driving signal SN is released. Between times t3 and t4, bit lines BL and ZBL remain at about 0.5×VDD. Signals SN and SP, however, drift towards 0.5 ×VDD level where bit lines BL and ZBL are at the moment.

In step 420 at time t4, after both signals SN and SP reach 0.5 ×VDD, signal SAE is applied with a High. Circuit 100 operates in the sensing mode as shown in FIG. 3.

At this time, $$VGS120 = VGS140 + (VtN120 - VtN140)$$

In effect, transistor 120 having threshold voltage VtN120 higher than threshold voltage VtN140 of transistor 140 has voltage VGS120 higher than voltage VGS140 of transistor 140. Further, currents IDS120 and IDS140 are equalized as explained above. As a result, the difference in threshold voltage of transistors 120 and 140 has been compensated.

In step 425 at about or soon after time t4, word line WL is applied with a High. Transistor 190 is turned on. Memory cell 195 is electrically coupled to bit line BL. Depending on the data stored in memory cell 195, bit line BL is pulled up or down whereas bit line ZBL is not driven and remains at the previous level. Stated differently, a bit line split between bit line BL and bit line ZBL develops. For illustration purposes, bit line BL is pulled towards a High, while bit line ZBL remains at the level close to −0.5×VDD.

In step 430 at time t5, when the bit line split is sufficient for sense amplifier 105 to sense the bit line split or, alternatively stated, to sense the data, signal SN is driven with a Low and then signal SP is driven with a High to turn on sense amplifier 105. The bit line split therefore further develops.

In step 435 at time t6, the bit line split has been developed to a full swing. In other words, bit line BL has reached voltage VDD, and bit line ZBL has reached voltage VSS. Detecting the voltage levels on bit lines BL and ZBL reveals the data stored in memory cell 195.

In step 440 at time t7, word line WL is applied with a Low to electrically disconnect memory cell 195 from bit line BL. Soon after time t7, signal SP is driven Low, which, together with signal SN being Low, turns off sense amplifier 105. Signal EQ is driven High, placing sense amplifier in a precharge mode similar to the time period between times t1 and t2.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes, embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

Some embodiments regard a sense amplifier. The sense amplifier comprises a first PMOS transistor, a second PMOS transistor, a third PMOS transistor, a fourth PMOS transistor, a first NMOS transistor, a second NMOS transistor, a third NMOS transistor, a fourth NMOS transistor, a control signal line, a first supply voltage node, a second supply voltage node, a first data line, and a second data line. The first PMOS transistor has a first PMOS drain, a first PMOS source, and a first PMOS gate. The second PMOS transistor has a second PMOS drain, a second PMOS source, and a second PMOS gate. The third PMOS transistor has a third PMOS drain, a third PMOS source, and a third PMOS gate. The fourth PMOS transistor has a fourth PMOS drain, a fourth PMOS source, and a fourth PMOS gate. The first NMOS transistor has a first NMOS drain, a first NMOS source, and a first NMOS gate. The second NMOS transistor has a second NMOS drain, a second NMOS source, and a second NMOS gate. The third NMOS transistor has a third NMOS drain, a third NMOS source, and a third NMOS gate. The fourth NMOS transistor has a fourth NMOS drain, a fourth NMOS source, and a fourth NMOS gate. The first PMOS source, the second PMOS source, and the second supply voltage node are coupled together. The first NMOS source, the third PMOS source, the fourth PMOS source, the second NMOS source, and the first supply voltage node are coupled together. The third NMOS gate, the fourth NMOS gate, the third PMOS gate, and the fourth PMOS gate are coupled together and to the control signal line. The first data line, the first PMOS drain, the first NMOS drain, the fourth NMOS drain, and the second PMOS gate are coupled together. The second data line, the second PMOS drain, the second NMOS drain, the third NMOS drain, and the first PMOS gate are coupled together. The first NMOS gate, the third NMOS source, and the third PMOS drain are coupled together. The second NMOS gate, the fourth NMOS source, and the fourth PMOS drain are coupled together Some embodiments regard a method. The method drives a first data line, a second data line, a first supply signal, and a second supply signal to a low logic value. The method stops driving the first data line, the second data line, the first supply signal, and the second supply signal. The method drives the first supply signal to a high logic value. A first voltage value of the first data line and a second voltage value of the second data line thereby rise. The method stops driving the first supply signal after the first voltage value and/or the second voltage value rises to a predetermined value. The first supply signal and the second supply signal thereby change towards the predetermined voltage value. The method electrically couples a memory cell to the first data line or the second data line. The method drives the first supply signal to the data low logic value and the second supply signal to the high logic value. The method detects the data value stored in the memory cell based on voltage levels on the first and the second data line.

Some embodiments regard a method. The method drives high a first signal and a second signal. The method drives low the first signal and the second signal. The second signal being low turns off a first NMOS transistor and a second NMOS transistor and turns on a first PMOS transistor and a second PMOS transistor. The method drives high a first supply signal. The method stops driving high the first supply signal. The method drives high the second signal to turn on the first NMOS transistor and the second NMOS transistor, and turn off the first PMOS transistor and the second PMOS transistor. The method electrically couples a memory cell to a first data line or a second data line. The method drives low the first supply signal and drives high a second supply signal. The first NMOS transistor is coupled between gates of a third PMOS transistor and a third NMOS transistor. The second NMOS transistor is coupled between gates of a fourth PMOS transistor and a fourth NMOS transistor. The first PMOS transistor is coupled between a gate of the third NMOS transistor and the first supply signal. The second PMOS transistor is coupled between a gate of the fourth NMOS transistor and the first supply signal.

The above methods show exemplary steps, but they are not necessarily performed in the order shown. Steps may be added, replaced, changed order, and/or eliminated as appropriate, in accordance with the spirit and scope of disclosed embodiments.

What is claimed is:
1. A sense amplifier comprising:
   a first PMOS transistor having a first PMOS drain, a first PMOS source, and a first PMOS gate;

a second PMOS transistor having a second PMOS drain, a second PMOS source, and a second PMOS gate;
a third PMOS transistor having a third PMOS drain, a third PMOS source, and a third PMOS gate;
a fourth PMOS transistor having a fourth PMOS drain, a fourth PMOS source, and a fourth PMOS gate;
a first NMOS transistor having a first NMOS drain, a first NMOS source, and a first NMOS gate;
a second NMOS transistor having a second NMOS drain, a second NMOS source, and a second NMOS gate;
a third NMOS transistor having a third NMOS drain, a third NMOS source, and a third NMOS gate;
a fourth NMOS transistor having a fourth NMOS drain, a fourth NMOS source, and a fourth NMOS gate;
a control signal line;
a first supply voltage node;
a second supply voltage node;
a first data line; and
a second data line;
wherein
the first PMOS source, the second PMOS source, and the second supply voltage node are coupled together;
the first NMOS source, the third PMOS source, the fourth PMOS source, the second NMOS source, and the first supply voltage node are coupled together;
the third NMOS gate, the fourth NMOS gate, the third PMOS gate, the fourth PMOS gate are coupled together and to the control signal line;
the first data line, the first PMOS drain, the first NMOS drain, the fourth NMOS drain, and the second PMOS gate are coupled together;
the second data line, the second PMOS drain, the second NMOS drain, the third NMOS drain, and the first PMOS gate are coupled together;
the first NMOS gate, the third NMOS source, and the third PMOS drain are coupled together; and
the second NMOS gate, the fourth NMOS source, and the fourth PMOS drain are coupled together.

2. The sense amplifier of claim 1, wherein, when the sense amplifier is sensing:
the third and the fourth NMOS transistors are configured to be on; and
the third and the fourth PMOS transistors are configured to be off.

3. The sense amplifier of claim 2, wherein at least one of the first data line and the second data line is configured to electrically couple to a memory cell when the sense amplifier is sensing.

4. The sense amplifier of claim 1, wherein prior to the sense amplifier being sensing:
the third and the fourth PMOS transistors are configured to be on; and
the third and the fourth NMOS transistors are configured to be off.

5. The sense amplifier of claim 4, wherein the sense amplifier is adapted to have at least one of the first data line or the second data line configured to reach a predetermined value from a low logic level based on a high logic level applied at the first voltage node for a time period.

6. The sense amplifier of claim 4, wherein the sense amplifier is adapted to have the first data line and the second data line configured to be at a low logic level prior to the third and the fourth PMOS transistors are configured to be on and the third and the fourth NMOS transistors are configured to be off.

7. The sense amplifier of claim 1, wherein the first data line and the second data line are coupled to a charging and equalizing circuit.

8. The sense amplifier of claim 1, wherein the first data line and the second data line are electrically coupled to a respective third data line and fourth data line.

9. The sense amplifier of claim 8, wherein the first data line and the second data line are electrically coupled to the respective third data line and fourth data line through the respective first transistor and second transistor.

10. A method comprising:
driving a first data line, a second data line, a first supply signal, a second supply signal to a low logic value;
stopping the driving of the first data line, the second data line, the first supply signal, and the second supply signal;
driving the first supply signal to a high logic value; a first voltage value of the first data line and a second voltage value of the second data line thereby rising;
stopping the driving of the first supply signal after the first voltage value and/or the second voltage value rises to a predetermined voltage value, the first supply signal and the second supply signal thereby changing towards the predetermined voltage value;
electrically coupling a memory cell to the first data line or the second data line;
driving the first supply signal to the data low logic value and the second supply signal to the high logic value; and
detecting a data value stored in the memory cell based on voltage levels on the first and the second data line.

11. The method of claim 10, wherein:
the first voltage value rising comprises configuring a first NMOS transistor to function as a first MOS diode; a drain of the first NMOS transistor is coupled to the first data line; and
the second voltage value rising comprises configuring a second NMOS transistor to function as a second MOS diode; a drain of the second NMOS transistor is coupled to the second data line.

12. The method of claim 11 further comprising:
turning on a first PMOS transistor coupled between a gate and a source of the first NMOS transistor to configure the first NMOS transistor to function as the first MOS diode; and
turning on a second PMOS transistor coupled between a gate and a source of the second NMOS transistor to configure the second NMOS transistor to function as the second MOS diode.

13. The method of claim 12 further comprising:
turning off a third NMOS transistor coupled between a gate of the first NMOS transistor and a gate of a third PMOS transistor; and
turning off a fourth NMOS transistor coupled between a gate of the second NMOS transistor and a gate of a fourth PMOS transistor.

14. The method of claim 13, wherein the voltage levels are detected when
the first PMOS transistor and the second PMOS transistor are off; and
the third NMOS transistor and the fourth NMOS transistor are on.

15. The method of claim 10, wherein:
driving the first data line and the second data line to the low logic value comprises activating a signal at gates of a first NMOS transistor, a second NMOS transistor, and a third NMOS transistor;
the first NMOS transistor is coupled between the first and the second data line;

the second and the third NMOS transistors are coupled in series between the first and the second data line; and stopping the driving of the first and the second data line to the low logic value comprises driving the first supply signal to a high logic value.

16. A method comprising:

driving high a first signal and a second signal;

driving low the first signal and the second signal; the second signal being low turning off a first NMOS transistor and a second NMOS transistor and turning on a first PMOS transistor and a second PMOS transistor;

driving high a first supply signal;

stopping the driving high of the first supply signal;

driving high the second signal to turn on the first NMOS transistor and the second NMOS transistor and turn off the first PMOS transistor and the second PMOS transistor;

electrically coupling a memory cell to a first data line or a second data line; and driving low the first supply signal and driving high a second supply signal;

wherein the first NMOS transistor is coupled between gates of a third PMOS transistor and a third NMOS transistor;

the second NMOS transistor is coupled between gates of a fourth PMOS transistor and a fourth NMOS transistor;

the first PMOS transistor is coupled between a gate of the third NMOS transistor and the first supply signal;

the second PMOS transistor is coupled between a gate of the fourth NMOS transistor and the first supply signal.

17. The method of claim 16, wherein driving high the first signal causes a first data line and a second data line to be at a low logic level.

18. The method of claim 16, wherein:

driving high the first supply signal causes a first voltage value at the first data line and a second voltage value at the second data line to increase, the first data line coupled to a drain of the third NMOS transistor and the second data line coupled to a drain of the fourth NMOS transistor; and stopping the driving of the first supply signal occurs after the first voltage value or the second voltage value reaches a predetermined value.

19. The method of claim 18, wherein:

the first voltage value increases based on the third NMOS transistor functioning as a first MOS diode; and the second voltage value increases based on the fourth NMOS transistor functioning as a second MOS diode.

20. The method of claim 16, wherein:

turning on the first PMOS transistor causes the third NMOS transistor to function as a first MOS diode; and turning on the second PMOS transistor causes the fourth NMOS transistor to function as a second MOS diode.

* * * * *